(12) United States Patent
Rendek, Jr. et al.

(10) Patent No.: US 8,912,641 B1
(45) Date of Patent: Dec. 16, 2014

(54) LOW PROFILE ELECTRONIC PACKAGE AND ASSOCIATED METHODS

(71) Applicant: Harris Corporation, Melbourne, FL (US)

(72) Inventors: Louis Joseph Rendek, Jr., Melbourne, FL (US); Michael Raymond Weatherspoon, West Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 14/021,109

(22) Filed: Sep. 9, 2013

(51) Int. Cl.
*H01L 23/48* (2006.01)
*H01L 23/053* (2006.01)
*H01L 21/52* (2006.01)
*H01L 23/10* (2006.01)
*H01L 23/00* (2006.01)
*H01L 23/58* (2006.01)

(52) U.S. Cl.
CPC .............. *H01L 23/053* (2013.01); *H01L 21/52* (2013.01); *H01L 23/10* (2013.01); *H01L 23/564* (2013.01); *H01L 23/585* (2013.01)
USPC ........................................................ 257/690

(58) Field of Classification Search
CPC ..... H01L 23/053; H01L 23/564; H01L 23/10; H01L 23/585; H01L 21/52
USPC ........................................................ 257/690
See application file for complete search history.

(56) References Cited

U.S. PATENT DOCUMENTS

| | | | |
|---|---|---|---|
| 3,903,590 A | 9/1975 | Yokogawa | |
| 5,353,498 A | 10/1994 | Fillion et al. | |
| 5,866,952 A | 2/1999 | Wojnarowski et al. | |
| 6,028,315 A * | 2/2000 | Bailey et al. | 250/455.11 |
| 6,396,148 B1 | 5/2002 | Eichelberger et al. | |
| 7,972,901 B2 | 7/2011 | Farrell et al. | |
| 8,345,433 B2 | 1/2013 | White et al. | |
| 2007/0025092 A1 | 2/2007 | Lee et al. | |
| 2007/0107932 A1 | 5/2007 | Jauniskis et al. | |
| 2008/0179724 A1 | 7/2008 | Gregory | |
| 2008/0277775 A1 | 11/2008 | Honer et al. | |
| 2012/0069288 A1 | 3/2012 | Das et al. | |
| 2012/0319256 A1* | 12/2012 | Lo et al. | 257/666 |
| 2013/0256858 A1* | 10/2013 | Komposch et al. | 257/676 |
| 2014/0103518 A1* | 4/2014 | Fu et al. | 257/704 |
| 2014/0264808 A1* | 9/2014 | Wolter et al. | 257/678 |

OTHER PUBLICATIONS

Thompson et al "Packaging of MMICs in Multilayer LCP Substates" IEEE Mocrowave and Wireless Components LEtters, vol. 16, No. 7, Jul. 2006: pp. 41-412.
"Emerging Directions for Packaging Technologies" Intel Technology Journal:vol. 6. Issue 2, May 16, 2002. pp. 61-76.

* cited by examiner

*Primary Examiner* — A. Sefer
(74) *Attorney, Agent, or Firm* — Allen, Dyer, Doppelt, Milbrath & Gilchrist, P.A.

(57) ABSTRACT

An electronic package includes a printed wiring board (PWB) having a die-receiving cavity therein, a semiconductor die in the die-receiving cavity and coupled to the PWB, and a lid mating ring at an upper surface of the PWB surrounding the die-receiving cavity. The lid mating ring has spaced apart pillar-receiving openings therein. A lid is coupled to the lid mating ring and covers the semiconductor die within the die-receiving cavity. The lid includes a liquid crystal polymer (LCP) layer, and spaced apart pillars extending downwardly from a lower surface of the LCP layer and received in corresponding ones of the spaced apart pillar-receiving openings.

26 Claims, 4 Drawing Sheets

LOW PROFILE ELECTRONIC PACKAGE AND ASSOCIATED METHODS

FIELD OF THE INVENTION

The present invention relates to the field of packaging electronic components, and more particularly, to a low profile electronic package and related methods.

BACKGROUND OF THE INVENTION

The basic purpose of packaging electronic components is to protect the components while at the same time providing electrical interconnections from the components through the package. Manufacturability and protection are key concerns. Due to ongoing market demand, electronic packages are continuously being driven toward smaller sizes and reduced footprints while still being environmentally robust. Even though these electronic packages are miniaturized they are still highly functional.

Miniaturization for active components may be achieved through the use of a semiconductor die with as little packaging as possible. One approach for miniaturization is based on a packaged surface mount device which includes a protective structure. Environmental protection from moisture and dust is one potential benefit when using this protective structure approach, even though the protective structure enclosing the semiconductor die may have a relatively high thickness (up to 1-2 mm) above the printed wiring board (PWB). A packaged surface mount device also allows an air gap or air bridge to exist between the semiconductor die and the package, which may be helpful when the semiconductor die is a radio frequency (RF) integrated circuit. The width of the protective structure for the packaged surface mount device may be upwards of 2× the footprint of the actual semiconductor die, for example.

For the same semiconductor die used in the packaged surface mount device, miniaturization may be further achieved using a packaged chip-on-board approach. The semiconductor die in the packaged chip-on-board approach is mechanically secured directly to the PWB with an adhesive and electrically interconnected via wire-bond connections. Instead of the protective structure, environmental protection is achieved by placing an epoxy glob over the semiconductor die. A width of a packaged chip-on-board setup may be upwards of 1.5× the footprint of the actual semiconductor die, for example. Yet a further reduction may be achieved when the semiconductor die is mounted to the PWB via flip-chip connections. Here, a width of the flip-chip approach may be between 1× to 1.25× the footprint of the bare die depending on the underfill fillet size.

Consequently, tradeoffs exist between providing environmental robustness and usability of the semiconductor die, particularly when placed in a mobile electronic device, for example. Component lid technologies can be used to provide environmental robustness for a semiconductor die. However, the resulting lids may be relatively thick due to molding technologies currently available, and the sealing methods are moderately inconvenient since they use relatively long epoxy cure times. An alternative to injection molding is to use a lid comprising a liquid crystal polymer (LCP) material. LCP materials have very low moisture permeability and can provide a near-hermetic seal while maintaining a thin profile.

An LCP lid for protecting a semiconductor die is disclosed in the article titled "Packaging of MMICs in Multilayer LCP Substrates" by Thompson et al. As illustrated in FIG. 1, the electronic package 10 includes a multilayered LCP lid 12 placed over an active semiconductor die 14 embedded within a cavity 15. The illustrated LCP lid 12 is about 10 mils thick and has a significantly lower profile as compared to an injection molded lid. The LCP lid 12 is laminated with the underlying layers 16, 17, 18, 19 which are also an LCP material. As discussed in the article, low melting temperature LCP layers (285° C.) are used to adhere generally thicker higher melting temperature core layers (315° C.) to create a homogeneous LCP electronic package. Nonetheless, there is still a need to improve upon component lid technologies for protecting semiconductor dies.

SUMMARY OF THE INVENTION

In view of the foregoing background, it is therefore an object of the present invention to provide a low profile electronic package with a lid that is relatively straightforward to integrate with the electronic package.

This and other objects, features, and advantages in accordance with the present invention are provided by an electronic package comprising a printed wiring board (PWB) having a die-receiving cavity therein, a semiconductor die in the die-receiving cavity and coupled to the PWB, and a lid mating ring at an upper surface of the PWB surrounding the die-receiving cavity. The lid mating ring may have a plurality of spaced apart pillar-receiving openings therein. A lid may be coupled to the lid mating ring and covers the semiconductor die within the die-receiving cavity. The lid may comprise a liquid crystal polymer (LCP) layer, and a plurality of spaced apart pillars may extend downwardly from a lower surface of the LCP layer and be received in corresponding ones of the plurality of spaced apart pillar-receiving openings. The LCP layer allows the lid to have a low profile while also providing a near-hermetic seal with the lid mating ring.

The lid may be coupled to the PWB using a conventional solder reflow process while the pillars prevent the lid from moving around during the process. The pillars thus facilitate assembly and add mechanical robustness to the lid. The semiconductor die may be coupled to the PWB via one of flip-chip and wire-bond connections. Fabrication time and cost of the electronic package may be reduced since a single reflow process may be used to couple the lid to the PWB at the same time as other passive surface mount components during final PWB assembly. In addition, since the lid is not over-molded or adhesive-attached, the lid may be later removed to expose the semiconductor die if additional testing and rework are needed.

The lid may further comprise a PWB mating ring carried by the LCP layer and aligned with the lid mating ring. Each of the lid mating ring and the PWB mating ring may define a continuous ring, for example.

The lid mating ring, the PWB mating ring, and the spaced apart pillars may each comprise a first metal having a relatively high melting temperature. The electronic package may further comprise a bonding layer between opposing portions of the lid mating ring and the PWB mating ring and the spaced apart pillars. The bonding layer may comprise a second metal having a relatively low melting temperature. For example, the first metal may comprise copper and the second metal layer may comprise a tin/lead alloy.

The semiconductor die may comprise a radio frequency (RF) integrated circuit, and the lid may define a predetermined air gap with adjacent portions of the RF integrated circuit. Combination of the pillars and the LCP lid advantageously allows for the air gap to be tightly controlled.

Another aspect is directed to a method for making an electronic package comprising providing a PWB having a die-receiving cavity therein, and forming a lid-mating ring at an upper surface of the PWB surrounding the die-receiving cavity. The lid-mating ring may have a plurality of spaced apart pillar-receiving openings therein. The method may further comprise positioning a semiconductor die in the die-receiving cavity and coupling to the PWB, and coupling a lid to the lid-mating ring. The lid may comprise an LCP layer, and a plurality of spaced apart pillars may extend downwardly from a lower surface of the LCP layer and be received in corresponding ones of the plurality of spaced apart pillar-receiving openings.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime notation is used to indicate similar elements in alternate embodiments.

Figure 1:
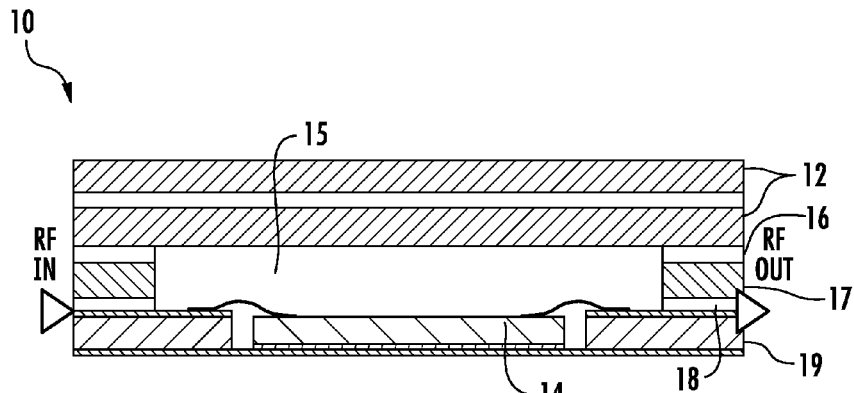
FIG. 1 is a cross-sectional view of an electronic package in accordance with the prior art.
Figure 2:
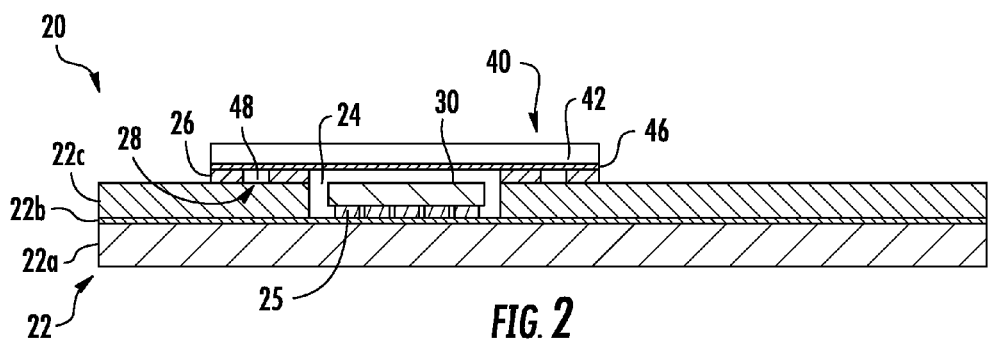
FIG. 2 is a cross-sectional view of an electronic package with the semiconductor die in a flip-chip configuration in accordance with the present invention.

Referring initially to FIG. 2, an electronic package 20 comprises a printed wiring board (PWB) 22 having a die-receiving cavity 24 therein. The PWB 22 includes a first dielectric layer 22a, a second dielectric layer 22c and an interconnect layer 22b therebetween. A semiconductor die 30 is in the die-receiving cavity and is coupled to the interconnect layer 22b via bonding pads 25. A lid mating ring 26 is at an upper surface of the PWB 22 surrounding the die-receiving cavity 24. The lid mating ring 26 has a plurality of spaced apart pillar-receiving openings 28 therein.

A lid 40 is coupled to the lid mating ring 26 and covers the semiconductor die 30 within the die-receiving cavity 24. The lid 40 comprises a liquid crystal polymer (LCP) layer 42, and a plurality of spaced apart pillars 48 extending downwardly from a lower surface of the LCP layer. The pillars 48 are received in corresponding ones of the spaced apart pillar-receiving openings 28. The lid 40 also includes a PWB mating ring 46 carried by the LCP layer 42 and aligned with the lid mating ring 26. The LCP layer 42 allows the lid to have a low profile while also providing a near-hermetic seal with the lid mating ring 26 as will be appreciated by those skilled in the art.

As will be discussed in greater detail below, the lid 40 may be coupled to the PWB 22 using a conventional solder reflow process while the pillars 48 prevent the lid from moving around during the process. The pillars 48 thus facilitate assembly and add mechanical robustness to the lid 40. In addition, since the lid 40 is not over-molded or adhesive-attached, the lid may be later removed to expose the semiconductor die 30 if additional testing and rework are needed.

The semiconductor die 30 is coupled to the PWB 22 via a flip-chip configuration. Fabrication time and cost of the electronic package may be reduced since a single reflow process may be used to couple the lid 40 to the PWB 22 at the same time as other passive surface mount components during final PWB assembly.

Figure 3:
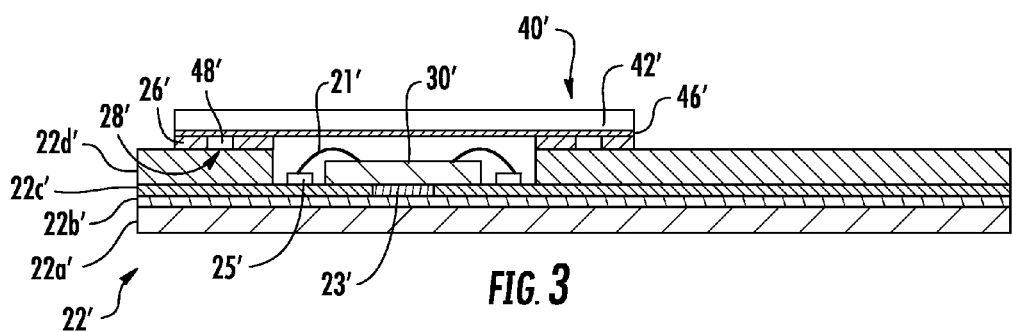
FIG. 3 is a cross-sectional view of another embodiment of the electronic package illustrated in FIG. 2 with the semiconductor die in a wire-bond configuration.

In another embodiment, the semiconductor die 30' is coupled to the PWB 22' via a wire-bond configuration, as illustrated in FIG. 3. The semiconductor die 30' is connected to the bonding pads 25' via wires 21'. The PWB 22' includes a first dielectric layer 22a', a second dielectric layer 22d', an interconnect layer 22c' coupled to the bonding pads 25', and a conducting layer 22b' coupled to a heat sink 23' under the semiconductor die 30'.

Figure 4:
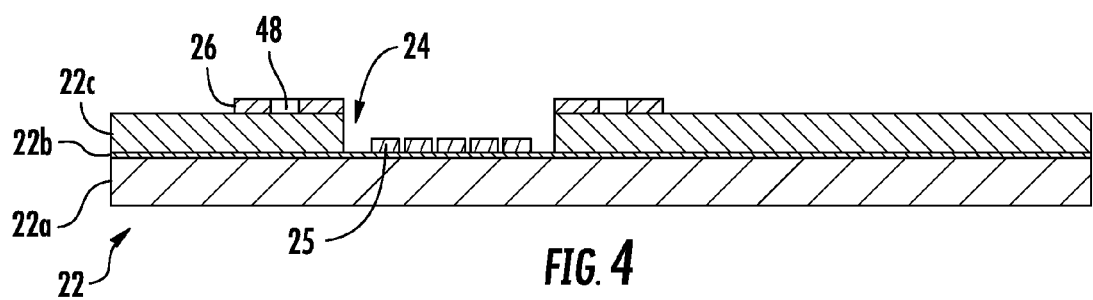
FIG. 4 is a cross-sectional view of the printed wiring board (PWB) with a die receiving cavity therein as illustrated in FIG. 2.
Figure 5:
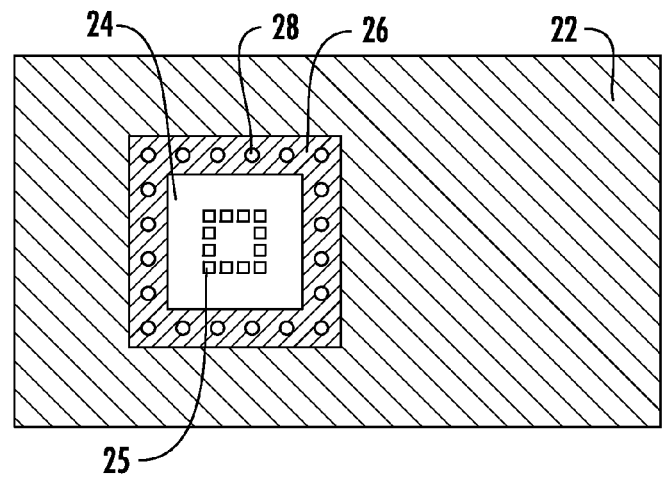
FIG. 5 is a top view of the PWB illustrated in FIG. 4.

Referring to the remaining figures, the steps of making the illustrated electronic package 20 will now be discussed. A PWB 22 as described above is provided, which may be any conventional printed wiring board. A cross-sectional view of the PWB 22 with a die receiving cavity 24 therein is illustrated in FIG. 4, and a corresponding top view is illustrated in FIG. 5.

The cavity 24 is formed in the PWB 22 to expose the interconnect layer 22b sandwiched between the first and second dielectric layers 22a, 22c. Bonding pads 25 are formed in the cavity 24 for contacting the interconnect layer 22b. The illustrated bonding pads 25 support a flip chip arrangement for the semiconductor die 30. The illustrated cavity 24 is rectangular shaped even though other cavity shapes are easily supported by the PWB 22 and lid 40. Similarly, the bonding pads 25 are in a rectangular pattern corresponding to the connections on the semiconductor die 30.

The lid mating ring 26 is a metal layer formed around a perimeter of the cavity 24 at an upper surface of the PWB 22, as readily appreciated by those skilled in the art. The spaced apart pillar-receiving openings 28 are then formed within the lid mating ring 26, as also readily appreciated by those skilled in the art.

The metallization ring may include copper, for example. A thickness of the lid mating ring 26 corresponds to the length of the pillars 48 extending from the LCP layer 42. The length of the pillars may be within a range of about 0.3 to 5 mils, for example.

As an alternative to forming the cavity 24 within the PWB 22, an area of the upper surface of the PWB may be built-up so as to form a cavity. The built-up area would also include a lid mating ring with pillar-receiving openings therein.

Figure 6:
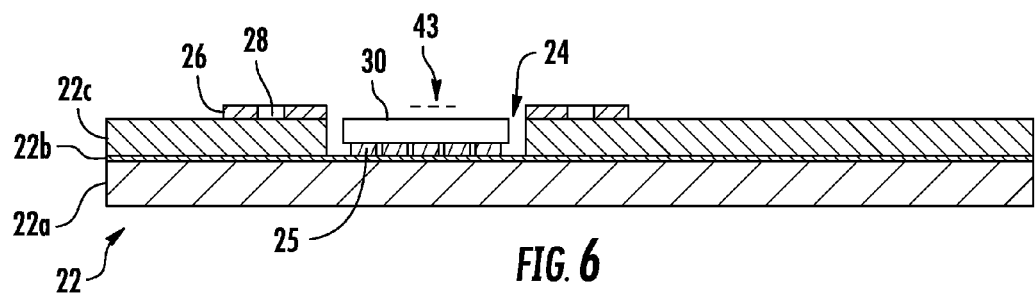
FIG. 6 is a cross-sectional side view of the PWB illustrated in FIG. 4 with the semiconductor die in the die receiving cavity.

The semiconductor die 30 is then coupled to the bonding pads 25, as illustrated in FIG. 6. The semiconductor die 30 may be a radio frequency (RF) integrated circuit, for example. When an RF integrated circuit is placed within the cavity 24, an air gap 43 is desirable between the LCP layer 42 and the RF integrated circuit, as illustrated in FIG. 6 without the lid 40 in place. The air gap 43 may thus be within a range of about 0.3-5 mils, for example. The air gap 43 may also be referred to as a component-to-lid height. This component-to-lid height is advantageously controlled based on the combination of the thickness of the lid mating ring 26 and the length of the spaced apart pillars 48 extending from the LCP layer 42, as well as the thickness of the semiconductor die 30. For an RF integrated circuit, the lid 40 may further include an electrically conductive layer, not shown, covering the lower surface of the LCP layer 42. This is to reduce electromagnetic interference (EMI) with any adjacent circuits that may be susceptible to RF signals.

Figure 7:
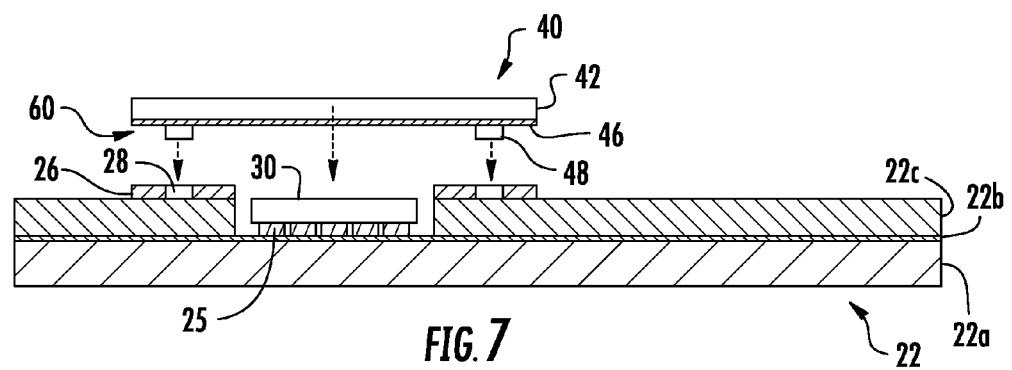
FIG. 7 is a cross-sectional view of the PWB illustrated in FIG. 6 with the corresponding lid positioned above the semiconductor die prior to a solder reflow process.

The next step is to couple the lid 40 to the lid-mating ring 28, as illustrated in FIG. 7. This may be based on a conventional solder reflow process. As discussed above, the lid 40 includes a LCP layer 42, and a plurality of spaced apart pillars 48 extending downwardly from a lower surface of the LCP layer. The pillars 48 are formed as integrated metal extensions from the LCP layer 42.

Figure 8:
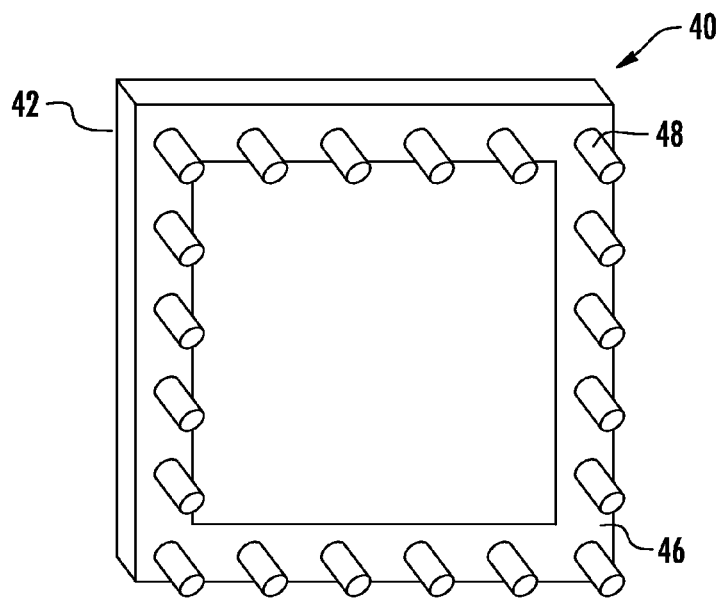
FIG. 8 is a perspective view of the underside of the lid illustrated in FIG. 7.

As best illustrated in FIG. 8, an underside of the lid 40 may also include a PWB mating ring 46 carried by the LCP layer 42. The PWB mating ring 46 is sized so as to be aligned with the lid mating ring 26, and may also be formed as a continuous metallization ring. The PWB mating ring 46 and pillars 48 may both include copper, for example.

While providing a controlled component-to-lid height 43, the lid 40 itself may be configured to have a very low profile. For example, the lid 40 may have a profile within a range of about 1 to 20 mils, for example. This includes the thickness of the LCP layer 42, the lid mating ring 26, and the length of the pillars 48 extending from the LCP layer 42. However, the thickness of the LCP layer 42 alone may be within a range of about 1.0 to 12 mils, for example.

Since a conventional solder reflow process may be used to couple the lid 40 to the PWB 22, a bonding layer 60 is placed between opposing portions of the lid mating ring 26 and the PWB mating ring 46 and the spaced apart pillars 48. As illustrated in FIG. 7, the bonding layer 60 is carried by the lid 40. Alternatively, the bonding layer may be carried by the PWB mating ring 46.

As noted above, the lid mating ring 26, the PWB mating ring 46, and the spaced apart pillars 48 each comprises a metal. More particularly, this metal may have a relatively high melting temperature. The bonding layer 60 also comprises a metal but has a relatively low melting temperature. For example, copper may be used for the metal associated with the lid mating ring 26, the PWB mating ring 46, and the spaced apart pillars 48. A tin/lead alloy may be used for the metal associated with the bonding layer 60, and other alternatives include gold-tin, for example. Other metals with similar characteristics are acceptable, as readily appreciated by those skilled in the art.

An advantage of using the solder reflow process is that the lid 40 may also be later removed without damaging the electronic package 20. With the lid 40 removed, the exposed semiconductor die 30 may then undergo additional testing and rework if necessary. The pillars 48 advantageously facilitate and hold or mechanically lock the lid 40 in place during the reflow process to prevent it from moving or shifting around.

Combination of the LCP lid 40 with the integrated pillars 48 provides a very low profile and a very robust packaging for bare die components 30. Use of requirement-defined mating/interlocking copper pillar technology (as opposed to a solder ring approach) allows for variable height lid fabrication to accommodate tightly-defined air gap 43 requirements while improving ease of fabrication.

Different thickness offerings of the LCP layer component, and combinations thereof, advantageously allow for variable lid stiffness with a path to different levels of robustness to meet specific requirements. Another advantage of the illustrated lid 40 is that it is easily integrated into existing PWB architectures. In addition, the use of a solder reflow process to couple the lid 40 to the PWB 22 allows other passive surface mount components to be flowed at the same time during final PWB assembly. This may help to reduce production time and lower fabrication costs pertaining to the electronic packaging 20. Moreover, the dielectric properties of the LCP layer 42 do not change upon exposure to moisture.

Availability of the LCP layer 42 with a melting temperature up to 335° C. allows the use of copper pillars 48 in both leaded and lead-free surface mount reflow processes. The use of a 335° C. melt temperature LCP as the lid also allows for a gold-tin hermetic lid seal.

Figure 9:
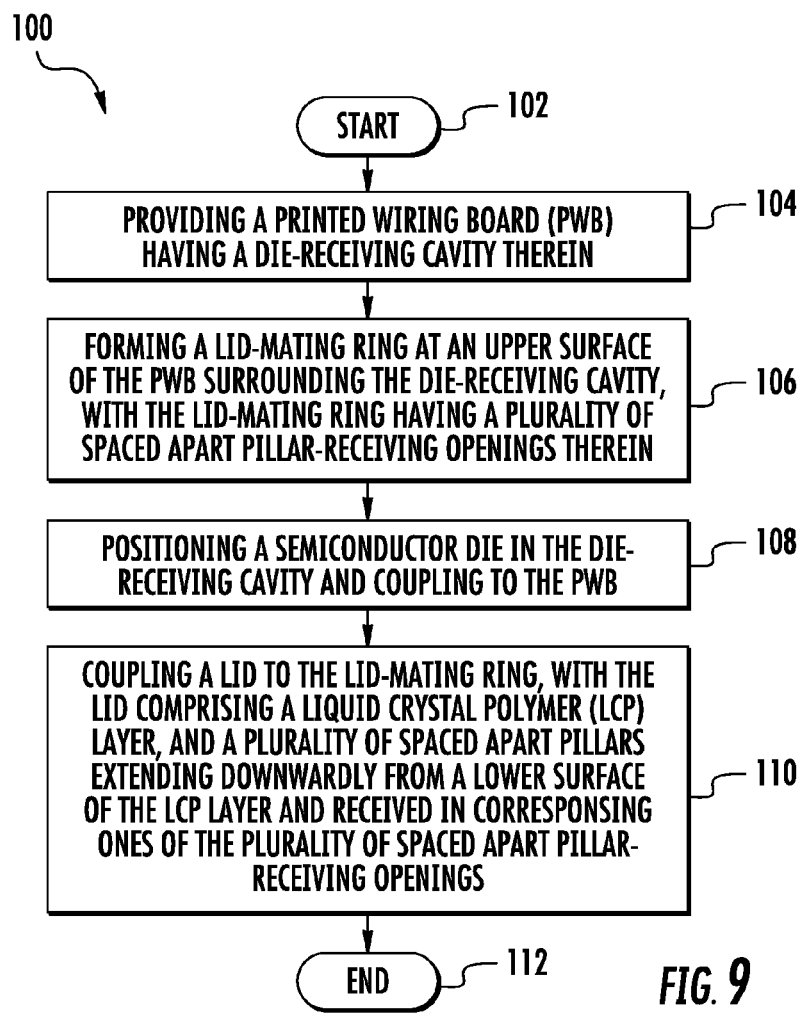
FIG. 9 is a flowchart illustrating a method for making the electronic package illustrated in FIG. 2.

The steps for making an electronic package 20 as discussed above will now be summarized in reference to the flowchart 100 in FIG. 9. From the start (Block 102), the method comprises providing a PWB 22 having a die-receiving cavity 24 therein at Block 104. A lid-mating ring 26 is formed at Block 106 at an upper surface of the PWB 22 surrounding the die-receiving cavity 24. The lid-mating ring 26 has a plurality of spaced apart pillar-receiving openings 28 therein. The method further comprises at Block 108 positioning a semiconductor die 30 in the die-receiving cavity 24 and coupling to the PWB 22. A lid 40 is coupled to the lid-mating ring 26 at Block 110. The lid 40 includes an LCP layer 42, and a plurality of spaced apart pillars 48 extending downwardly from a lower surface of the LCP layer and received in corresponding ones of the plurality of spaced apart pillar-receiving openings 28. The method ends at Block 112.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic package comprising:
   a printed wiring board (PWB) having a die-receiving cavity therein;
   a semiconductor die in the die-receiving cavity and coupled to said PWB;
   a lid mating ring at an upper surface of said PWB surrounding the die-receiving cavity, said lid mating ring having a plurality of spaced apart pillar-receiving openings therein; and
   a lid coupled to said lid mating ring and covering said semiconductor die within the die-receiving cavity, said lid comprising
      a liquid crystal polymer (LCP) layer, and
      a plurality of spaced apart pillars extending downwardly from a lower surface of said LCP layer and received in corresponding ones of said plurality of spaced apart pillar-receiving openings.

2. The electronic package according to claim 1 wherein said lid is removable.

3. The electronic package according to claim 1 wherein said lid further comprises a PWB mating ring carried by said LCP layer and aligned with said lid mating ring.

4. The electronic package according to claim 3 wherein said lid mating ring, said PWB mating ring, and said plurality of spaced apart pillars each comprises a first metal having a relatively high melting temperature; and further comprising a bonding layer between opposing portions of said lid mating ring and said PWB mating ring and said plurality of spaced apart pillars; and wherein said bonding layer comprises a second metal having a relatively low melting temperature.

5. The electronic package according to claim 4 wherein said first metal comprises copper and said second metal layer comprises a tin/lead alloy.

6. The electronic package according to claim 3 wherein each of said lid mating ring and PWB mating ring defines a continuous ring.

7. The electronic package according to claim 1 wherein said semiconductor die comprises a radio frequency (RF) integrated circuit.

8. The electronic package according to claim 1 wherein said LCP layer has a planar shape.

9. The electronic package according to claim 1 wherein said lid defines a predetermined air gap with adjacent portions of said semiconductor die.

10. The electronic package according to claim 1 wherein said semiconductor die is coupled to said PWB via one of flip-chip and wire-bond connections.

11. An electronic package comprising:
   a printed wiring board having a die-receiving cavity therein;
   a semiconductor die in the die-receiving cavity and coupled to said PWB;
   a lid mating ring at an upper surface of said PWB surrounding the die-receiving cavity, said lid mating ring having a plurality of spaced apart pillar-receiving openings therein; and
   a removable lid coupled to said lid mating ring and covering said semiconductor die within the die-receiving cavity, said removable lid comprising
      a liquid crystal polymer (LCP) layer having a planar shape, and
      a plurality of spaced apart pillars extending downwardly from a lower surface of said LCP layer and received in corresponding ones of said plurality of spaced apart pillar-receiving openings, and
      a PWB mating ring carried by said LCP layer and aligned with said lid mating ring.

12. The electronic package according to claim 11 wherein said lid mating ring, said PWB mating ring, and said plurality of spaced apart pillars each comprises a first metal having a relatively high melting temperature; and further comprising a bonding layer between opposing portions of said lid mating ring and said PWB mating ring and said plurality of spaced apart pillars; and wherein said bonding layer comprises a second metal having a relatively low melting temperature.

13. The electronic package according to claim 11 wherein each of said lid mating ring and PWB mating ring defines a continuous ring.

14. The electronic package according to claim 11 wherein said semiconductor die comprises a radio frequency (RF) integrated circuit.

15. A method for making an electronic package comprising:
   providing a printed wiring board (PWB) having a die-receiving cavity therein;
   forming a lid-mating ring at an upper surface of the PWB surrounding the die-receiving cavity, with the lid-mating ring having a plurality of spaced apart pillar-receiving openings therein;
   positioning a semiconductor die in the die-receiving cavity and coupling the semiconductor die to the PWB; and
   coupling a lid to the lid-mating ring, with the lid comprising a liquid crystal polymer (LCP) layer, and a plurality of spaced apart pillars extending downwardly from a lower surface of the LCP layer and received in corresponding ones of the plurality of spaced apart pillar-receiving openings.

16. The method according to claim 15 further comprising removing the lid to expose the semiconductor die.

17. The method according to claim 15 wherein the lid further comprises a PWB mating ring carried by the LCP layer and aligned with the lid mating ring.

18. The method according to claim 17 wherein the lid mating ring, the PWB mating ring, and the plurality of spaced apart pillars each comprises a first metal having a relatively high melting temperature; and wherein the coupling further comprises using a bonding layer between opposing portions of the lid mating ring and the PWB mating ring and the plurality of spaced apart pillars, with the bonding layer comprising a second metal having a relatively low melting temperature.

19. The method according to claim 18 wherein the first metal comprises copper and the second metal layer comprises a tin/lead alloy.

20. The method according to claim 17 wherein each of the lid mating ring and PWB mating ring defines a continuous ring.

21. The method according to claim 15 wherein the semiconductor die comprises a radio frequency integrated circuit.

22. The method according to claim 15 wherein the lid further comprises an electrically conductive layer covering the lower surface of the LCP layer.

23. The method according to claim 15 wherein the LCP layer has a planar shape.

24. The method according to claim 15 wherein the lid defines a predetermined air gap with adjacent portions of the semiconductor die.

25. The method according to claim 15 wherein coupling the semiconductor die to the PWB is performed via wire-bond connections.

26. The method according to claim 15 wherein the semiconductor die comprises a flip-chip configuration; and wherein coupling the semiconductor die to the PWB coupling the lid to the lid-mating ring are performed at a same time.

* * * * *